US012628533B2

(12) United States Patent
Park et al.

(10) Patent No.: US 12,628,533 B2
(45) Date of Patent: May 12, 2026

(54) ORGANIC LIGHT EMITTING DIODE DISPLAY DEVICE

(71) Applicant: LG Display Co., Ltd., Seoul (KR)

(72) Inventors: Je-Beom Park, Paju-si (KR);
Sung-Rae Lee, Paju-si (KR); Ji-Su Yoon, Paju-si (KR); Jin-Ryun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 728 days.

(21) Appl. No.: 17/944,944

(22) Filed: Sep. 14, 2022

(65) Prior Publication Data

US 2023/0180566 A1      Jun. 8, 2023

(30) Foreign Application Priority Data

Dec. 7, 2021    (KR) ......................... 10-2021-0174043

(51) Int. Cl.
*H10K 59/80*          (2023.01)
*H10K 59/35*          (2023.01)
*H10K 59/38*          (2023.01)

(52) U.S. Cl.
CPC ......... *H10K 59/879* (2023.02); *H10K 59/351* (2023.02); *H10K 59/353* (2023.02); *H10K 59/38* (2023.02)

(58) Field of Classification Search
CPC .... H10K 59/879; H10K 59/351; H10K 59/38; H10K 50/858; H10H 29/855; H10H 20/855; H10H 29/362
See application file for complete search history.

(56) References Cited

U.S. PATENT DOCUMENTS 12,493,209 B2 * 12/2025 Blum ................ G02F 1/133526
2008/0218063 A1 *  9/2008 Greiner .................. H10K 50/11
                                                              313/504

(Continued)

FOREIGN PATENT DOCUMENTS

CN          104040412 A      9/2014
CN          111108602 A      5/2020
            (Continued)

OTHER PUBLICATIONS

Korean Intellectual Property Office, Office Action, Korean Patent Application No. 10-2021-0174043, Oct. 13, 2025, 12 pages.
(Continued)

*Primary Examiner* — Steven B Gauthier
*Assistant Examiner* — E. Rhett Cheek
(74) *Attorney, Agent, or Firm* — Fenwick & West LLP

(57) ABSTRACT

An organic light emitting diode display device includes: a substrate including first to third subpixels; first to third light emitting diodes in the first to third subpixels, respectively, on the substrate; and a transmittance controlling layer on an outer surface of the substrate corresponding to an emission direction of a light emitted from the first to third light emitting diodes, the transmittance controlling layer including a first lens and a second lens covering the first lens, wherein one of the first to third subpixels includes a green subpixel, wherein the first lens is disposed to correspond to an emission area of the green subpixel, and wherein the second lens is disposed to correspond to the first to third subpixels.

16 Claims, 7 Drawing Sheets

(56)                    References Cited

U.S. PATENT DOCUMENTS

| | | | |
|---|---|---|---|
| 2012/0217521 A1* | 8/2012 | Ohta | H10K 59/879 257/89 |
| 2013/0141693 A1 | 6/2013 | McCabe et al. | |
| 2017/0125489 A1* | 5/2017 | Jang | H10K 59/351 |
| 2018/0012940 A1* | 1/2018 | Park | H10K 50/858 |
| 2020/0058888 A1* | 2/2020 | Sugiyama | G02B 5/20 |
| 2021/0074932 A1 | 3/2021 | Park et al. | |
| 2021/0098746 A1* | 4/2021 | Guo | H10K 59/8791 |
| 2021/0193968 A1 | 6/2021 | Lee et al. | |
| 2021/0399264 A1* | 12/2021 | Ueda | H10K 59/879 |
| 2022/0099865 A1* | 3/2022 | Gu | G02F 1/133512 |
| 2022/0328794 A1* | 10/2022 | Huang | H10K 59/38 |
| 2023/0116030 A1* | 4/2023 | Sui | H10K 59/879 257/40 |
| 2023/0126988 A1* | 4/2023 | Seong | H10K 59/124 257/40 |
| 2023/0176402 A1* | 6/2023 | McCabe | B29D 11/00865 351/159.61 |
| 2023/0180585 A1* | 6/2023 | Xia | H10K 59/879 257/40 |
| 2023/0221469 A1* | 7/2023 | Matsusaki | G02B 3/0068 359/794 |
| 2023/0276682 A1* | 8/2023 | Hamachi | H05B 33/12 257/91 |
| 2024/0292701 A1* | 8/2024 | Ikeda | H10K 59/35 |
| 2025/0017067 A1* | 1/2025 | Hochman | H10K 59/352 |
| 2025/0389939 A1* | 12/2025 | Suzuki | G02B 19/0014 |

FOREIGN PATENT DOCUMENTS

| | | |
|---|---|---|
| CN | 112840744 A | 5/2021 |
| CN | 113013349 A | 6/2021 |
| JP | 2019-185068 A | 10/2019 |
| KR | 10-2021-0030783 A | 3/2021 |
| KR | 10-2021-0069050 A | 6/2021 |
| KR | 10-2021-0078802 A | 6/2021 |

OTHER PUBLICATIONS

China National Intellectual Property Administration, Office Action, Chinese Patent Application No. 202211212722.4, Dec. 27, 2025, 13 pages.

* cited by examiner

ORGANIC LIGHT EMITTING DIODE DISPLAY DEVICE

CROSS REFERENCE TO RELATED APPLICATIONS

The present application claims the priority benefit of Republic of Korea Patent Application No. 10-2021-0174043 filed in Republic of Korea on Dec. 7, 2021, which is hereby incorporated by reference herein in its entirety.

BACKGROUND

Technical Field

The present disclosure relates to an organic light emitting diode display device, and more particularly, to an organic light emitting diode display device where a color sense difference according to a viewing angle is improved.

Discussion of the Related Art

Recently, with the advent of an information-oriented society and as the interest in information displays for processing and displaying a massive amount of information and the demand for portable information media have increased, a display field has rapidly advanced. Thus, various light and thin flat panel display devices have been developed and highlighted.

Among the various flat panel display devices, an organic light emitting diode (OLED) display device is an emissive type device and does not include a backlight unit used in a non-emissive type device such as a liquid crystal display (LCD) device. As a result, the OLED display device has a light weight and a thin profile.

In addition, the OLED display device has advantages of a viewing angle, a contrast ratio, and power consumption as compared with the LCD device. Furthermore, the OLED display device can be driven with a low direct current (DC) voltage and has rapid response speed. Moreover, since the inner elements of the OLED display device have a solid phase, the OLED display device has high durability against an external impact and has a wide available temperature range.

When a white color is displayed in the OLED display device, a color sense of a white color may be changed according to a viewing angle of a user. When the OLED display device displaying a white color is viewed from a side, a greenish phenomenon where a white color has a light green color may occur.

The above color sense difference may be recognized by a user to cause a luminosity deterioration and may be recognized by a user as a display deterioration.

SUMMARY

Accordingly, the present disclosure is directed to an organic light emitting diode display device that substantially obviates one or more of the problems due to limitations and disadvantages of the related art.

An object of the present disclosure is to provide an organic light emitting display device where a greenish phenomenon is improved.

Another object of the present disclosure is to provide an organic light emitting diode display device where a recognition of a luminosity deterioration by a user is prevented by minimizing a color sense difference of a white color display.

Additional features and advantages of the present disclosure will be set forth in the description which follows, and in part will be apparent from the description, or may be learned by practice of the disclosure. These and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, an organic light emitting diode display device includes: a substrate including first to third subpixels; first to third light emitting diodes in the first to third subpixels, respectively, on the substrate; and a transmittance controlling layer on an outer surface of the substrate corresponding to an emission direction of a light emitted from the first to third light emitting diodes, the transmittance controlling layer including a first lens and a second lens covering the first lens, wherein one of the first to third subpixels includes a green subpixel, wherein the first lens is disposed to correspond to an emission area of the green subpixel, and wherein the second lens is disposed to correspond to the first to third subpixels.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure and together with the description serve to explain the principles of the present disclosure. In the drawings.

DETAILED DESCRIPTION

Figure 1:
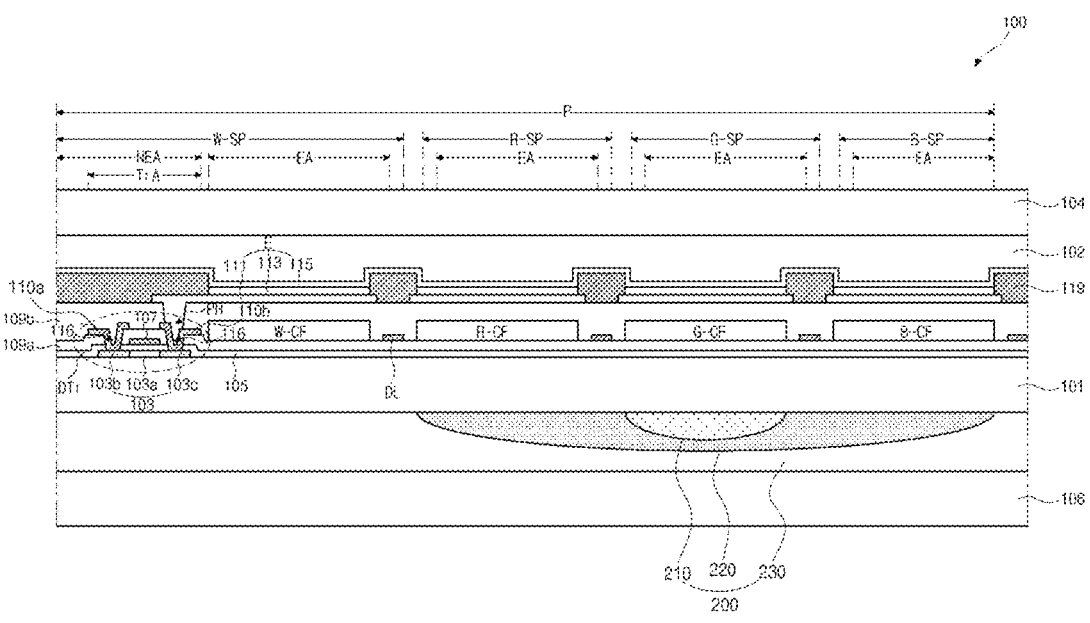
FIG. 1 is a cross-sectional view showing a unit pixel including four subpixels of an organic light emitting diode display device according to an embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, a touch device, a touch display device including the touch device and a method of driving the touch device according to embodiments of the present disclosure will be described in detail with reference to the accompanying drawings. In the following description, like reference numerals designate like elements throughout. When a detailed description of well-known functions or configurations related to this document is determined to unnecessarily cloud a gist of the inventive concept, the detailed description thereof will be omitted or will be made brief.

Figure 2:
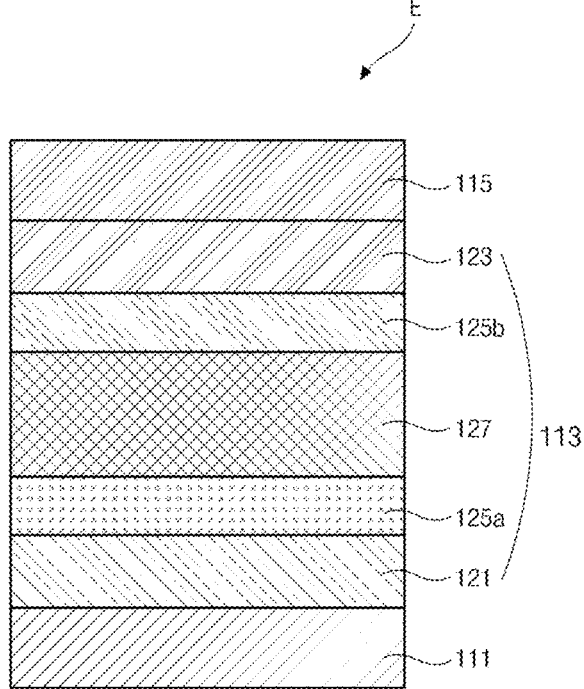
FIG. 2 is a view showing a light emitting diode of an organic light emitting diode display device according to an embodiment of the present disclosure.

FIG. 1 is a cross-sectional view showing a unit pixel including four subpixels of an organic light emitting diode display device according to an embodiment of the present disclosure, and FIG. 2 is a view showing a light emitting diode of an organic light emitting diode display device according to an embodiment of the present disclosure.

Although a driving thin film transistor (TFT) DTr and a switching thin film transistor (not shown) are disposed in each of white, red, green and blue subpixels W-SP, R-SP, G-SP and B-SP on a substrate 101, the driving TFT DTr in one of the white, red, green and blue subpixels W-SP, R-SP, G-SP and B-SP is shown for convenience of illustration and simplicity of drawing.

In FIGS. 1 and 2, a plurality of subpixels including white, red, green and blue subpixels W-SP, R-SP, G-SP and B-SP are defined on a substrate 101 of an organic light emitting diode (OLED) display device 100 according to an embodiment of the present disclosure. Although each of the plurality of subpixels W-SP, R-SP, G-SP and B-SP may be defined by crossing of a data line DL and a gate line (not shown), it is not limited thereto.

At least three adjacent subpixels R-S P, G-SP and B-SP may constitute a single unit pixel P for a color display. For example, a single unit pixel P may include the red, green and blue subpixels R-S P, G-SP and B-SP adjacent to each other, and the red, green and blue subpixels R-S P, G-SP and B-SP may emit red, green and blue colored lights, respectively.

The single unit pixel P may further include the white subpixel W-SP, and the single unit pixel P including the white, red, green and blue subpixels W-SP, R-SP, G-SP and B-SP may have a rectangular shape.

Each of the white, red, green and blue subpixels W-SP, R-SP, G-SP and B-SP includes an emission area EA, and a bank 119 is disposed along a boundary of the emission area EA to constitute a non-emission area NEA.

A switching TFT and a driving TFT DTr are disposed in the non-emission area NEA of each of the white, red, green and blue subpixels W-SP, R-SP, G-SP and B-SP, and a light emitting diode E including a first electrode 111, an organic emitting layer 113 and a second electrode 115 are disposed in the emission area EA of each of white, red, green and blue subpixels W-SP, R-SP, G-SP and B-SP.

The switching TFT and the driving TFT DTr are connected to each other, and the driving TFT DTr is connected to the light emitting diode E.

A semiconductor layer 103 is disposed in a switching area TrA of each of white, red, green and blue subpixels W-SP, R-SP, G-SP and B-SP on the substrate 101. The semiconductor layer 103 has an active region 103a of intrinsic silicon constituting a channel and source and drain regions 103b and 103c of an impurity-doped silicon at both sides of the active region 103a.

A gate insulating layer 105 is disposed on the semiconductor layer 103.

A gate electrode 107 is disposed on the gate insulating layer 105 over the active region 103a of the semiconductor layer 103 and a gate line (not shown) is disposed on the gate insulating layer 105.

A first interlayer insulating layer 109a is disposed on the gate electrode 107 and the gate line. The first interlayer insulating layer 109a and the gate insulating layer 105 have first and second semiconductor contact holes 116 exposing the source and drain regions 103b and 103c, respectively, at both sides of the active region 103a.

Source and drain electrodes 110a and 110b spaced apart from each other are disposed on the first interlayer insulating layer 109a having the first and second semiconductor contact holes 116. The source and drain electrodes 110a and 110b are connected to the source and drain regions 103b and 103c through the first and second semiconductor contact holes 116, respectively.

A second interlayer insulating layer 109b is disposed on the source and drain electrodes 110a and 110b and the first interlayer insulating layer 109a exposed between the source and drain electrodes 110a and 110b.

The source and drain electrodes 110a and 110b, the semiconductor layer 103 including the source and drain regions 103b and 103c connected to the source and drain electrodes 110a and 110b, the gate insulating layer 105 on the semiconductor layer 103 and the gate electrode 107 constitute the driving TFT DTr.

Although not shown, the switching TFT may have the same structure as the driving TFT DTr and may be connected to the driving TFT DTr.

Although the switching TFT and the driving TFT DTr have a top gate type where the semiconductor layer 103 includes polycrystalline silicon or an oxide semiconductor material in the embodiment, the switching TFT and the driving TFT DTr may have a bottom gate type where the semiconductor layer 103 includes intrinsic amorphous silicon and impurity-doped amorphous silicon in another embodiment.

When the semiconductor layer 103 includes an oxide semiconductor material, a light shielding layer may be disposed under the semiconductor layer 103 and a buffer layer may be disposed between the light shielding layer and the semiconductor layer 103.

The second interlayer insulating layer 109b has a drain contact hole PH exposing the drain electrode 110b of the driving TFT DTr, and a first electrode 111 is disposed on the second interlayer insulating layer 109b. The first electrode 111 is connected to the drain electrode 110b of the driving TFT DTr through the drain contact hole PH and includes a material having a relatively high work function to constitute an anode of the light emitting diode E.

The first electrode 111 is disposed in each of the white, red, green and blue subpixels W-SP, R-SP, G-SP and B-SP, and a bank 119 is disposed between the adjacent first electrodes 111. The first electrode 111 has a separated structure in each of the white, red, green and blue subpixels W-SP, R-SP, G-SP and B-SP with the bank 119 as a border among the white, red, green and blue subpixels W-SP, R-SP, G-SP and B-SP.

An organic emitting layer 113 is disposed on the first electrode 111 and the bank 119. The organic emitting layer 113 may have a single layer of an emitting material or a multiple layer of a hole injecting layer, a hole transporting layer, an emitting material layer, an electron transporting layer and an electron injecting layer.

In the OLED display device 100, the organic emitting layer 113 of each of the white, red, green and blue subpixels W-SP, R-SP, G-SP and B-SP may emit a white colored light.

A second electrode 115 is disposed on the organic emitting layer 113 and the entire substrate 101.

The second electrode 115 may include a material having a relatively low work function to constitute a cathode of the light emitting diode E.

In the OLED display device 100, when a voltage is applied to the first and second electrodes 111 and 115 according to a selected signal, a hole injected from the first electrode 111 and an electron injected from the second electrode 115 are transferred to the organic emitting layer 113 to constitute an exciton. When the exciton transitions from an excited state to a ground state, light is generated to be emitted as a visible ray.

The light emitting diode E includes the first electrode 111, the second electrode 115 and first and second emitting layers 125a and 125b between the first and second electrodes 111 and 115.

The first electrode 111 is an anode supplying a hole. The first electrode 111 may include one of a metal oxide such as indium tin oxide (ITO) and indium zinc oxide (IZO), a mixture of a metal and an oxide such as zinc oxide aluminum (ZnO:Al), tin oxide antimony (SnO$_2$:Sb) and a conductive polymer such as poly(3-methylthiophene), poly[3, 4-(ethylene-1,2-dioxy)thiophene](PEDT), polypyrrole and polyaniline. In addition, the first electrode 111 may include one of carbon nano tube (CNT), graphene and silver nano wire.

The second electrode 115 is a cathode supplying an electron and may include a material having a relatively low work function. For example, the second electrode 115 may have a double layered structure of a single layer or multiple layers of a metal alloy of a first metal such as silver (Ag) and a second metal such as magnesium (Mg).

The first and second emitting layers 125a and 125b, a first hole transporting layer (HTL) 121 and a first electron transporting layer (ETL) 123 are disposed between the first and second electrodes 111 and 115. The first electron transporting layer 123 is disposed under the second electrode 115, and the second emitting layer 125b, the first emitting layer 125a and the first hole transporting layer 121 are sequentially disposed under the first electron transporting layer 123.

An electron injecting layer (EIL) may be further disposed between the second electrode 115 and the first electron transporting layer 123. An electron may be easily injected from the second electrode 115 to the first electron transporting layer 123 by the electron injecting layer.

The first electron transporting layer 123 may have at least two layers and may include at least two materials. A hole blocking layer (HBL) may be further disposed between the first electron transporting layer 123 and the second emitting layer 125b. Since the hole injected into the second emitting layer 125b is prevented from returning to the first electron transporting layer 123 by the hole blocking layer, a combination of the hole and the electron in the second emitting layer 125b is improved and an emission efficiency of the second emitting layer 125b is improved.

The first electron transporting layer 123 and the hole blocking layer may be formed of a single layer. The first electron transporting layer 123, the hole blocking layer and the first electron injecting layer may be an electron transferring layer.

The first electron transporting layer 123 supplies the electrons from the second electrode 115 to the second emitting layer 125b, and the first hole transporting layer 121 supplies the holes from the first electrode 111 to the first emitting layer 125a.

As a result, the electrons supplied through the first electron transporting layer 123 and the holes supplied through the first hole transporting layer 121 are recombined in the first emitting layer 125a to generate light.

The first emitting layer 125a may emit first colored light. For example, the first emitting layer 125a may include one of a blue emitting layer, a deep blue emitting layer and a sky blue emitting layer. The first colored light emitted from the first emitting layer 125a may have a wavelength within a range of about 440 nm to about 480 nm.

The first emitting layer 125a may include at least one host and a dopant or a mixed host having two or more hosts and at least one dopant.

The mixed host may include a host having a hole transporting property and a host having an electron transporting property. Since a charge balance of the emitting layer is controlled by the mixed host, an efficiency of the emitting layer is improved.

The dopant may include a fluorescent dopant or a phosphorescent dopant.

The second emitting layer 125b is disposed on the first emitting layer 125a, and an auxiliary layer 127b is disposed between the first emitting layer 125a and the second emitting layer 125b.

The auxiliary layer 127 may include a second hole transporting layer (HTL) and a second electron transporting layer (ETL), and an electron injecting layer (EIL) may be further disposed between the second electron transporting layer and the first emitting layer 125a. A hole injecting layer (HIL) may be further disposed on the second hole transporting layer.

An electron blocking layer (EBL) may be further disposed between the first emitting layer 125a and the second hole transporting layer. Since the electron injected into the first emitting layer 125a is prevented from returning to the first hole transporting layer by the electron blocking layer, a combination of the hole and the electron in the first emitting layer 125a is improved and an emission efficiency of the first emitting layer 125a is improved.

The second hole transporting layer and the electron blocking layer may be formed of a single layer, and a hole blocking layer (HBL) may be further disposed on the second electron transporting layer to improve an efficiency of the first emitting layer 125a.

The second electron transporting layer and the hole blocking layer may be formed of a single layer. The second electron transporting layer, the hole blocking layer and the electron injecting layer may be an electron transferring layer, and the second hole transporting layer, the electron blocking layer and the hole injecting layer may be a hole transporting layer.

The second emitting layer 125b may emit a second colored light. For example, the second emitting layer 125b may include one of a green emitting layer and a red emitting layer. The second colored light emitted from the second emitting layer 125b may have a wavelength within a range of about 510 nm to about 650 nm.

The second emitting layer 125b may include at least one host and a dopant or a mixed host having two or more hosts and at least one dopant.

The mixed host may include a host having a hole transporting property and a host having an electron transporting property. Since a charge balance of the emitting layer is controlled by the mixed host, an efficiency of the emitting layer is improved.

The dopant may include a fluorescent dopant or a phosphorescent dopant.

A charge generating layer (CGL) may be further disposed between the second electron transporting layer and the second hole transporting layer of the auxiliary layer 127. The charge generating layer may control a charge balance between the first emitting layer 125a and the second emitting layer 125b.

The charge generating layer includes a positive type charge generating layer (P-CGL) and a negative type charge generating layer (N-CGL). The positive type charge generating layer may inject holes into the first emitting layer 125a, and the negative type charge generating layer may inject electrons into the second emitting layer 125b.

Although two emitting layers 125a and 125b are disposed between the first and second electrodes 111 and 115 in the light emitting diode E according to an embodiment of the present disclosure, three emitting layers may be disposed between the first and second electrodes 111 and 115 in another embodiment.

The light emitting diode E according to an embodiment of the present disclosure has two-stack structure where a blue colored light emitted from the first emitting layer 125a and a green colored light and a red colored light emitted from the second emitting layer 125b are mixed to emit a white colored light.

The OLED display device 100 according to an embodiment of the present disclosure including the light emitting diode E has a bottom emission type such that the white colored light emitted from the organic emitting layer 113 in each of the white, red, green and blue subpixels W-SP, R-SP, G-SP and B-SP passes through the first electrode 111.

A color converting pattern is disposed on the first interlayer insulating layer 109a to correspond to the emission area EA of each of the white, red, green and blue subpixels W-SP, R-SP, G-SP and B-SP.

The color converting pattern may include color filter patterns W-CF, R-CF, G-CF and B-CF disposed to correspond to the white, red, green and blue subpixels W-SP, R-SP, G-SP and B-SP. The color filter patterns W-CF, R-CF, G-CF and B-CF convert a color of the white colored light emitted from the organic emitting layer 113. The white, red, green and blue color filter patterns W-CF, R-CF, G-CF and B-CF may be disposed to correspond to the emission area EA of the white, red, green and blue subpixels W-SP, R-SP, G-SP and B-SP, respectively.

The white color filter pattern W-CF in the emission area EA of the white subpixel W-SP may be omitted, and the white colored light emitted from the organic emitting layer 113 may be transmitted intactly.

As a result, in the OLED display device 100 according to an embodiment of the present disclosure, the white, red, green and blue subpixels W-SP, R-SP, G-SP and B-SP emit the white, red, green and blue colored lights, respectively, to obtain a full color of a high luminance.

A passivation layer 102 and an encapsulation substrate 104 of a thin film shape are disposed on the driving TFT DTr and the light emitting diode E such that the OLED display device 100 is encapsulated through the passivation layer 102 and the encapsulation substrate 104.

The passivation layer 102 prevents moisture from penetrating into the OLED display device 100 and protects the light emitting diode E and the TFTs of the OLED display device 100 from external impact.

In the OLED display device 100 according to an embodiment of the present disclosure, a transmittance controlling layer 200 is further disposed on a rear surface of the substrate 101 where light passes.

The transmittance controlling layer 200 includes a first lens 210 covering the green subpixel G-SP, a second lens covering the red and blue subpixels R-SP and B-SP and a planarizing layer 230 covering the second lens 220.

In the OLED display device 100 according to an embodiment of the present disclosure, a greenish phenomenon according to a viewing angle in a white display is prevented by the transmittance controlling layer 200.

As a result, a color sense difference of a white display is minimized to obtain the OLED display device 100 where recognition of a luminosity deterioration by a user is prevented.

A polarizing plate 106 may be disposed on the transmittance controlling layer 200 to prevent reduction of contrast ratio due to external light. In the OLED display device 100, since the polarizing plate 106 blocking the external light incident from an exterior is disposed at a transmission direction of the light emitted from the organic emitting layer 113 in a driving mode for an image display, the contrast ratio is improved.

Figure 3A:
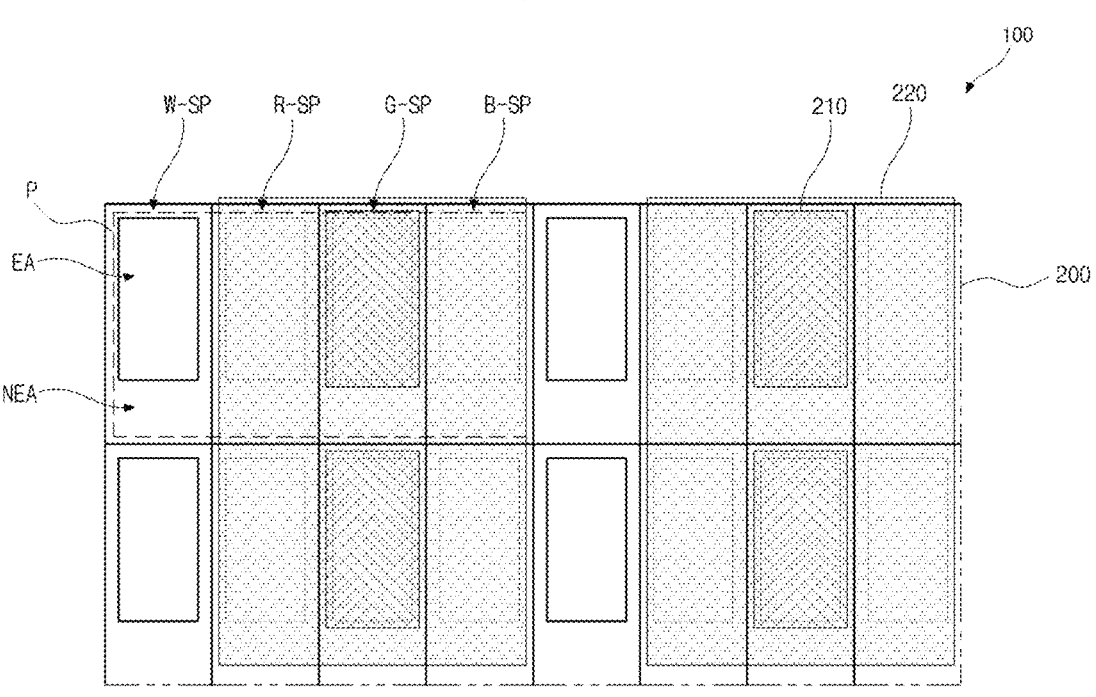
FIG. 3A is a plan view showing a unit pixel including four subpixels of an organic light emitting diode display device according to an embodiment of the present disclosure.
Figure 3B:
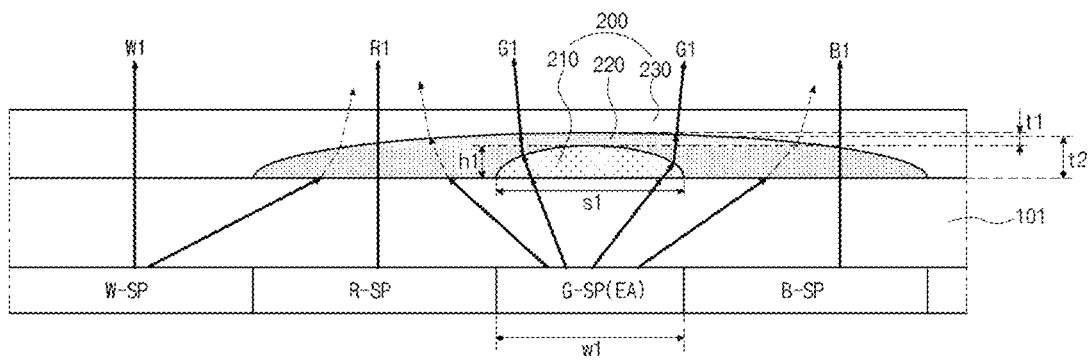
FIG. 3B is a view showing a light path in a transmittance controlling layer of an organic light emitting diode display device according to an embodiment of the present disclosure.
Figure 4:
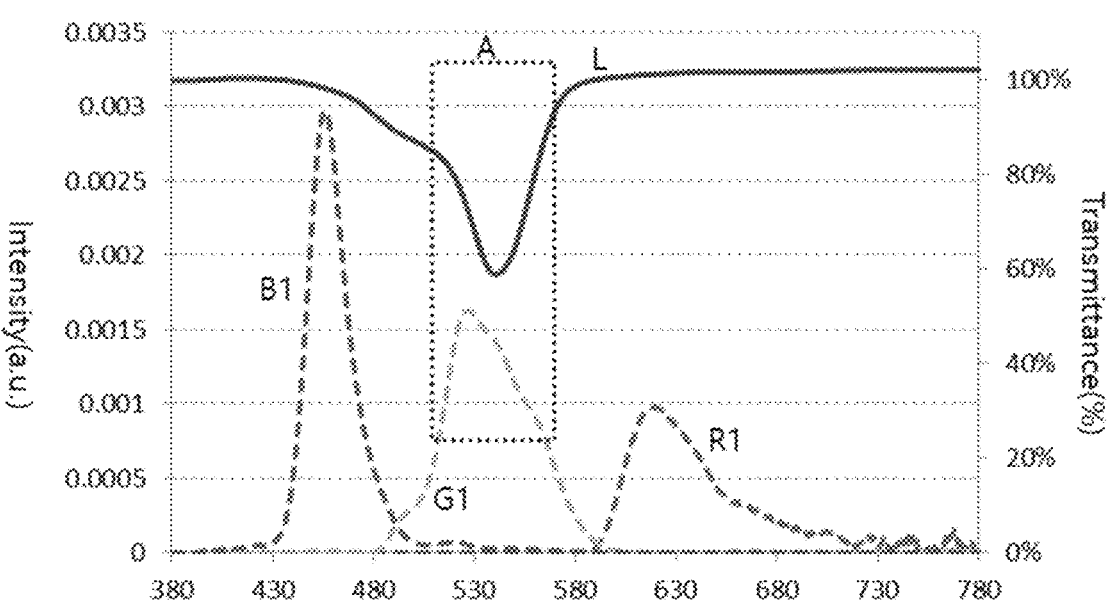
FIG. 4 is a graph showing a spectrum of a light passing through a transmittance controlling layer of an organic light emitting diode display device according to an embodiment of the present disclosure.

FIG. 3A is a plan view showing a unit pixel including four subpixels of an organic light emitting diode display device according to an embodiment of the present disclosure, FIG. 3B is a view showing a light path in a transmittance controlling layer of an organic light emitting diode display device according to an embodiment of the present disclosure, and FIG. 4 is a graph showing a spectrum of light passing through a transmittance controlling layer of an organic light emitting diode display device according to an embodiment of the present disclosure.

In FIGS. 3A, 3B and 4, the single unit pixel P includes the white, red, green and blue subpixels W-SP, R-SP, G-SP and B-SP. Each of the white, red, green and blue subpixels W-SP, R-SP, G-SP and B-SP includes the emission area EA, and the bank 119 (of FIG. 1) is disposed along the boundary of the emission area EA to constitute the non-emission area NEA.

The white, red, green and blue subpixels W-SP, R-SP, G-SP and B-SP may be alternately disposed along a horizontal direction, and the plurality of the white, red, green and blue subpixels W-SP, R-SP, G-SP and B-SP may be disposed along a vertical direction.

As a result, the white, red, green and blue subpixels W-SP, R-SP, G-SP and B-SP are disposed to have a stripe structure.

Although the white, red, green and blue subpixels W-SP, R-SP, G-SP and B-SP have the same width as each other for convenience of illustration in the embodiment, the white, red, green and blue subpixels W-SP, R-SP, G-SP and B-SP may have different widths from each other in another embodiment.

In the OLED display device 100 according to an embodiment of the present disclosure, the transmittance controlling layer 200 is disposed on an outer surface of the substrate 101 where the light passes. The first lens 210 of the transmittance controlling layer 200 is disposed to correspond to the emission area EA of the green subpixel G-SP among the white, red, green and blue subpixels W-SP, R-SP, G-SP and B-SP, and the second lens 220 of the transmittance controlling layer 200 is disposed to cover the first lens 210, the green subpixel G-SP and the red and blue subpixels R-SP and B-SP adjacent to the green subpixel G-SP.

The first and second lenses 210 and 220 refract the light emitted from the organic emitting layer 113 (of FIG. 2) of each of the white, red, green and blue subpixels W-SP, R-SP, G-SP and B-SP outwardly to improve light extraction efficiency (out coupling efficiency). The first and second lenses 210 and 220 may have an outwardly (upwardly) convex shape.

As a result, the first and second lenses 210 and 220 may have a cross-section of a half elliptical shape or a half circular shape having a round surface.

A diameter s1 of the first lens 210 is greater than a width w1 of the emission area EA of the green subpixel G-SP such that the first lens 210 covers the entire emission area EA and all the light emitted from the emission area EA of the green subpixel G-SP is accommodated by the first lens 210.

The first lens 210 has a size greater than the emission area EA of the at least green subpixel G-SP to cover the entire emission area EA. The width w1 of the emission area EA may correspond to the greatest width in the emission area EA and the non-emission area NEA.

A height h1 of the first lens 210 may be equal to or smaller than the diameter s1 of the first lens 210. For example, the height h1 of the first lens 210 may be about 0.3 times to about 1 times of the diameter s1 of the first lens 210.

When the height h1 of the first lens 210 is smaller than about 0.3 times of the diameter s1 of the first lens 210, an angle of the round surface is relatively small. As a result, the light is not concentrated outwardly (upwardly) and a light extraction efficiency is not improved. When the height h1 of the first lens 210 is equal to or greater than about 0.3 times of the diameter s1 of the first lens 210, an angle of the round surface is relatively great, the light is concentrated outwardly (upwardly) and the light extraction efficiency is improved. When the height h1 of the first lens 210 is greater than about 1 times of the diameter s1 of the first lens 210, the height h1 becomes relatively great. As a result, fabrication process becomes difficult. When the height h1 of the first lens 210 is equal to and smaller than about 1 times of the diameter s1 of the first lens 210, the fabrication process is not very complicated.

For example, when the height h1 and the diameter s1 of the first lens 210 has a ratio of about 0.5:1, the most effective result may be obtained.

In the transmittance controlling layer 200, a refractive index of the first lens 210 may be greater than a refractive index of the substrate 101 where the light emitted from the green subpixel G-SP passes. For example, the substrate 101 and the first lens 210 may have a refractive index difference equal to or greater than about 0.1.

In the OLED display device 100 having the light emitting diode E (of FIG. 2), when the substrate 101 is formed of a glass having a refractive index of about 1.5, the first lens 210 may have a refractive index of about 1.6 to about 1.8.

As a result, when the green colored light G1 emitted from the green subpixel G-SP passes through the substrate 101 to enter the first lens 210, the green colored light G1 passes from a medium of the substrate 101 of a relatively low refractive index to a medium of the first lens 210 of a relatively high refractive index. According to Snell's law, the green colored light G1 has a refractive angle greater than an incident angle with respect to a normal line of an interface surface between the substrate 101 and the first lens 210.

A refractive index of the second lens 220 on the first lens 210 is smaller than a refractive index of the first lens 210. For example, the first lens 210 and the second lens 220 may have a refractive index difference equal to or greater than about 0.1.

When the first lens 210 has a refractive index of about 1.6 to about 1.8, the second lens 220 may have a refractive index of about 1.4 to about 1.5.

After the green colored light G1 passing through the substrate 101 and incident to the first lens 210 is refracted with the refractive angle greater than the incident angle due to Snell's law, the green colored light G1 is refracted upwardly at an interface between the first lens 210 and the second lens 220.

As a result, the green colored light G1 passing through the first lens 210 is focused upwardly. The path of the green colored light G1 emitted from the green subpixel G-SP is changed by the first lens 210 to be focused upwardly.

The second lens 220 covering the first lens 210 and the red and blue subpixels R-SP and B-SP adjacent to the green subpixel G-SP includes light absorbing material. The light absorbing material may absorb light having a part of a wavelength band of the light emitted from the white, red, green and blue subpixels W-SP, R-SP, G-SP and B-SP.

For example, the light absorbing material in the second lens 220 may have an absorption wavelength band of about 480 nm to about 600 nm and an absorption wavelength peak of about 530 nm to about 540 nm such that the light absorbing material absorbs the light of a wavelength band of about 530 nm to about 540 nm among the light incident to the second lens 220.

The light absorbing material may include a combination of at least two of pyrrol methan group absorption dye, rhodamine group absorption dye, cyanine group absorption dye, tetra aza porphyrin group absorption dye. For example, the light absorbing material may include a combination of cyanine group absorption dye and a tetra aza porphyrin group absorption dye.

Since the second lens 220 of the light absorbing material is disposed to cover the first lens 210, the second lens 220 has a first thickness t1 corresponding to the first lens 210 and a second thickness t2 corresponding to an outer periphery of the first lens 210. The second thickness t2 is greater than the first thickness t1.

The first thickness t1 may be a minimum thickness of the second lens 220, and the second thickness t2 may be freely designed in a height including the first thickness t1 and covering the first lens 210.

As a result, the second lens 220 is disposed such that the first thickness t1 corresponds to the green subpixel G-SP and the second thickness t2 corresponds to the red and blue subpixels R-SP and B-SP.

When the red and blue colored lights R1 and B1 emitted from the red and blue subpixels R-SP and B-SP enter the second lens 220, the light of a wavelength band of about 530 nm to about 540 nm among the red and blue colored lights R1 and B1 is absorbed by the light absorption material and does not pass through the second lens 220 of the second thickness t2.

Since a part of the green colored light G1 emitted from the green subpixel G-SP is transmitted toward the adjacent red and blue subpixels R-SP and B-SP, the green colored light G1 is partially mixed with the red and blue colored lights R1 and B1. The light of a wavelength band of about 530 nm to about 540 nm among the red and blue colored lights R1 and B1 where the green colored light G1 is mixed does not pass through and is absorbed by the second lens 220 of the second thickness t2.

As a result, only the red colored light R1 of a relatively high purity passes through the second lens 220 in the red subpixel R-SP, and only the blue colored light B1 of a relatively high purity passes through the second lens 220 in the blue subpixel B-SP.

Each of the red and blue colored lights R1 and B1 is a clear light having a relatively high color purity where a light of a different wavelength band is not mixed. In the OLED display device 100 according to an embodiment of the present disclosure, only the pure red colored light R1 is emitted in the red subpixel R-SP through the second lens 220, and only the pure blue colored light B1 is emitted in the blue subpixel B-SP through the second lens 220. As a result, a color reproducibility of the light passing through the red and blue subpixels R-SP and B-SP is improved.

Specifically, since the light of a wavelength band of about 530 nm to about 540 nm is not mixed with the red and blue colored lights R1 and B1, the greenish phenomenon due to the green colored light G1 corresponding to the wavelength band of about 530 nm to about 540 nm for a white display is prevented.

As a result, a color sense difference is minimized even when a viewing angle of a user is changed, and a recognition of a luminosity deterioration by a user is prevented.

Since a part of the white colored light W1 emitted from the white subpixel W-SP is transmitted toward the adjacent red and blue subpixels R-SP and B-SP, the part of the white colored light W1 emitted from the white subpixel W-SP passes through the second lens 220. Since the light of a wavelength band of about 530 nm to about 540 nm among the white colored light W1 is absorbed while passing through the second lens 220, the greenish phenomenon is further prevented.

Since the second lens 220 is disposed to correspond to the green subpixel G-SP, the light of a wavelength band of about 530 nm to about 540 nm among the green colored light G1 emitted from the green subpixel G-SP is also absorbed while passing through the second lens 220. However, since the second lens 220 corresponding to the second lens 220 has the first thickness t1, an absorption amount of the light of a wavelength band of about 530 nm to about 540 nm is minimized.

Since the second lens 220 is formed to have the first and second thicknesses t1 and t2, a light absorption amount is changed according to a region of the second lens 220 where the light passes. For example, the light passing through the second lens 220 corresponding to the first thickness t1 may have a first light absorption amount, and the light passing through the second lens 220 corresponding to the second thickness t2 may have a second light absorption amount greater than the first light absorption amount.

Since the red and blue colored lights R1 and B1 pass through the second lens 220 of the second thickness t2, the light of a wavelength band of about 530 nm to about 540 nm among the red and blue colored lights R1 and B1 is absorbed as the second light absorption amount. Since the green colored light G1 passes through the second lens 220 of the first thickness t1, the light of a wavelength band of about 530 nm to about 540 nm among the green colored light G1 is absorbed as the first light absorption amount smaller than the second light absorption amount.

The first light absorption amount may be insignificant as compared to the second light absorption amount. Specifically, since the green colored light G1 emitted from the green subpixel G-SP is focused upwardly due to the first lens 210. As a result, the first light absorption amount by the second lens 220 may be compensated by a light amount focused by the first lens 210.

In FIG. 4, a horizontal axis represents a wavelength (nm) and a vertical axis represents an emission intensity and a transmittance.

The emission intensity is a relative value with respect to a maximum value of an emission spectrum. For example, the emission intensity of the blue color may have a peak at a wavelength of about 455 nm, the emission intensity of the green color may have a peak at a wavelength of about 535 nm, and the emission intensity of the red color may have a peak at a wavelength of about 620 nm.

A transmittance of a light L passing through the transmittance controlling layer 200 is reduced in a region A, and the transmittance controlling layer 200 may influence only a wavelength band corresponding to the region A.

The region A corresponds to a wavelength band of about 530 nm to about 540 nm. Among the red and blue colored lights R1 and B1 emitted from the organic emitting layer 113 (of FIG. 2) of each of the white, red, green and blue subpixels W-SP, R-WP, G-SP and B-SP, the light of the wavelength band of about 530 nm to about 540 nm is absorbed by the second lens 220 of the transmittance controlling layer 200 and does not pass through the second lens 220.

As a result, the blue colored light B1 of a high purity is emitted from the blue subpixel B-SP and the red colored light R1 of a high purity is emitted from the red subpixel R-SP.

The red, green and blue colored lights R1, G1 and B1 are clear light having a relatively high color purity where a light of a different wavelength band is not mixed. In the OLED display device 100 according to an embodiment of the present disclosure, only the pure red colored light R1 is emitted in the red subpixel R-SP through the second lens 220 of the transmittance controlling layer 200, and only the pure blue colored light B1 is emitted in the blue subpixel B-SP through the second lens 220 of the transmittance controlling layer 200. As a result, color reproducibility of the light passing through the white, red, green and blue subpixels W-SP, R-SP, G-SP and B-SP is improved.

Specifically, since the light of a different wavelength band is not mixed to the red and blue colored lights R1 and B1, the greenish phenomenon due to the green colored light G1 for a white display is prevented.

A planarizing layer 230 is disposed on the second lens 220 to compensate a step difference due to the first and second lenses 210 and 220.

For example, the planarizing layer 230 may have a thickness of about 5 μm to about 20 μm to compensate for the step difference and may include an organic material such as polyimide, benzocyclobutene series resin and acrylate.

The planarizing layer 230 may have a refractive index similar to the second lens 220. When the second lens 220 has a refractive index of about 1.4 to about 1.5, the planarizing layer 230 may have a refractive index of about 1.4 to about 1.5.

As a result, it is prevented that the light passing through the second lens 220 and incident to the planarizing layer 230 is refracted at an interface between the second lens 220 and the planarizing layer 230 due to a refractive index difference and a light path is changed. In addition, a total reflectance due to a refractive index difference between two medium, i.e., the second lens 220 and the planarizing layer 230 is prevented.

Accordingly, an inner total reflectance at the interface between the second lens 220 and the planarizing layer 230 may be prevented.

FIGS. 5A to 5C, 6A to 6C, 7A to 7C are experimental result graphs showing a light spectrum with respect to a viewing angle of red, green and blue colored lights, where a horizontal axis represents a viewing angle and a vertical axis represents an emission intensity.

Figure 5A:
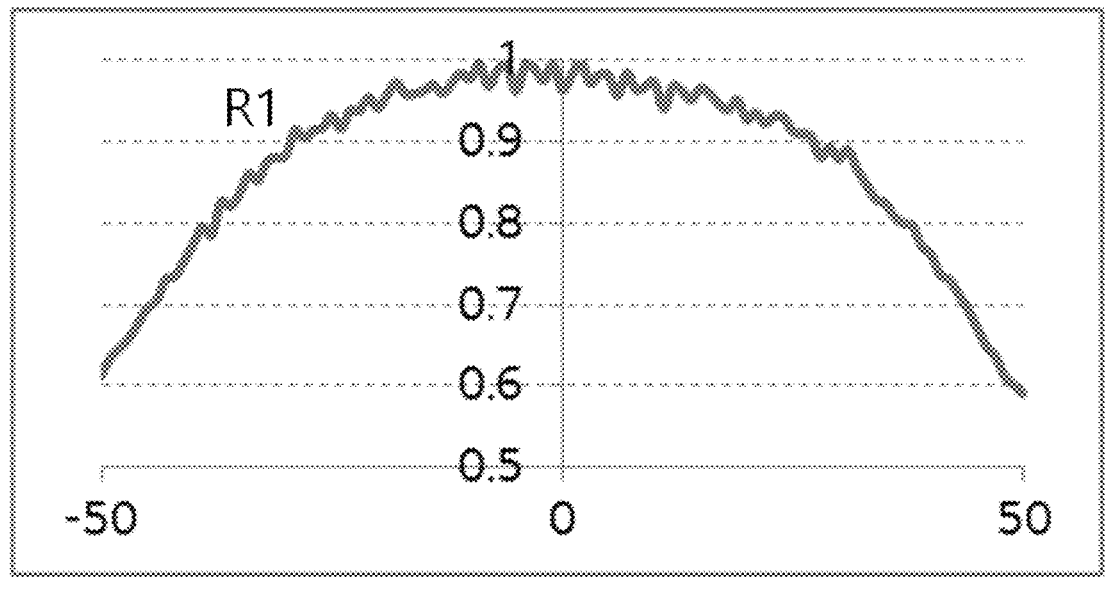
FIGS. 5A to 5C are graphs showing a light spectrum with respect to a viewing angle of red, green and blue colored lights, respectively, having passed through a substrate of an organic light emitting diode display device according to an embodiment of the present disclosure.
Figure 5B:
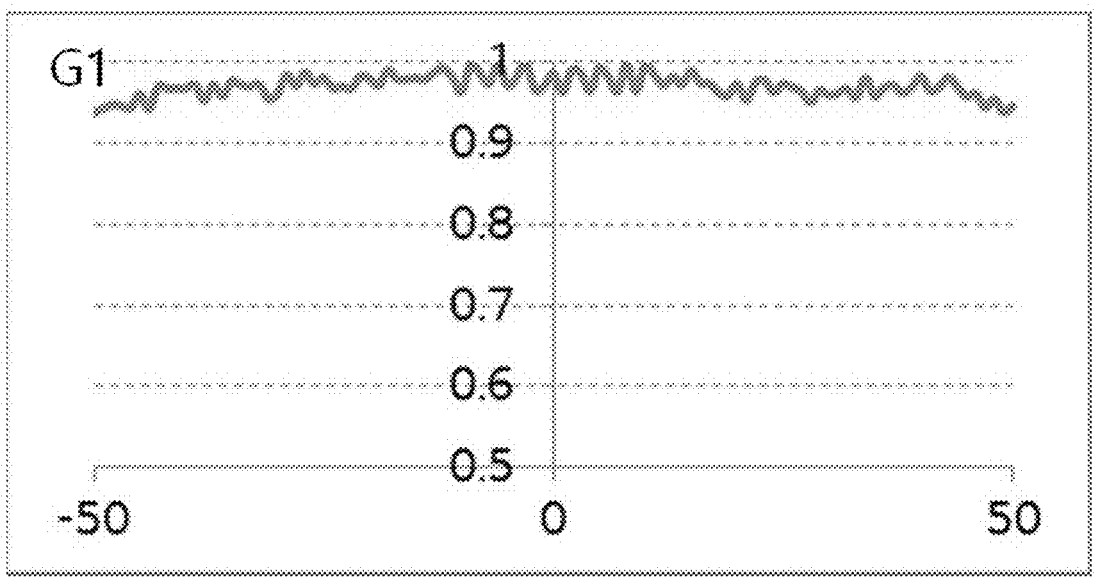
Figure 5C:
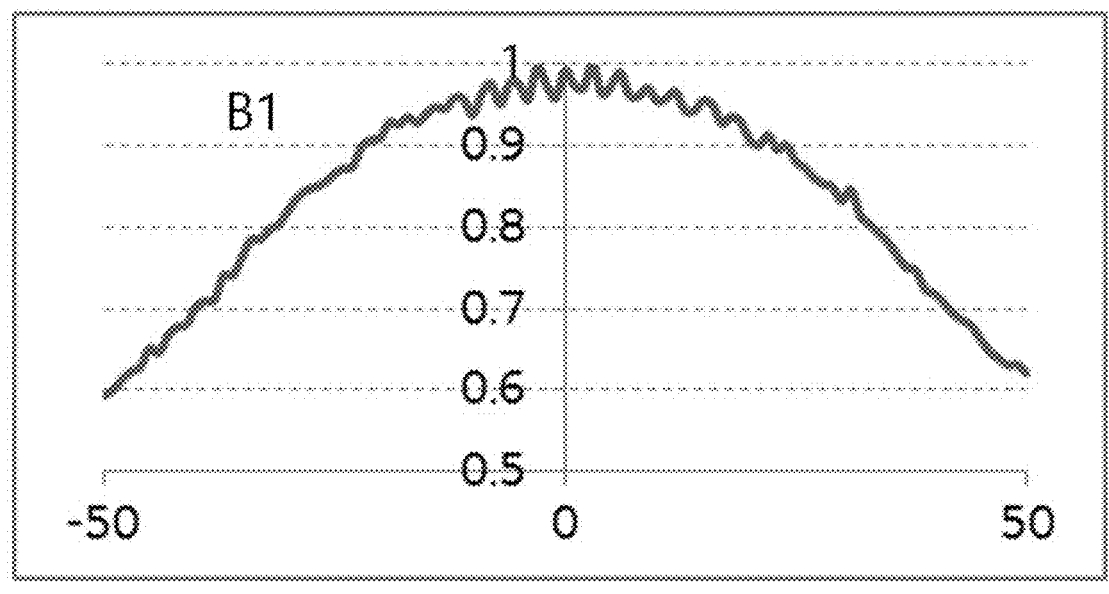
Figure 6A:
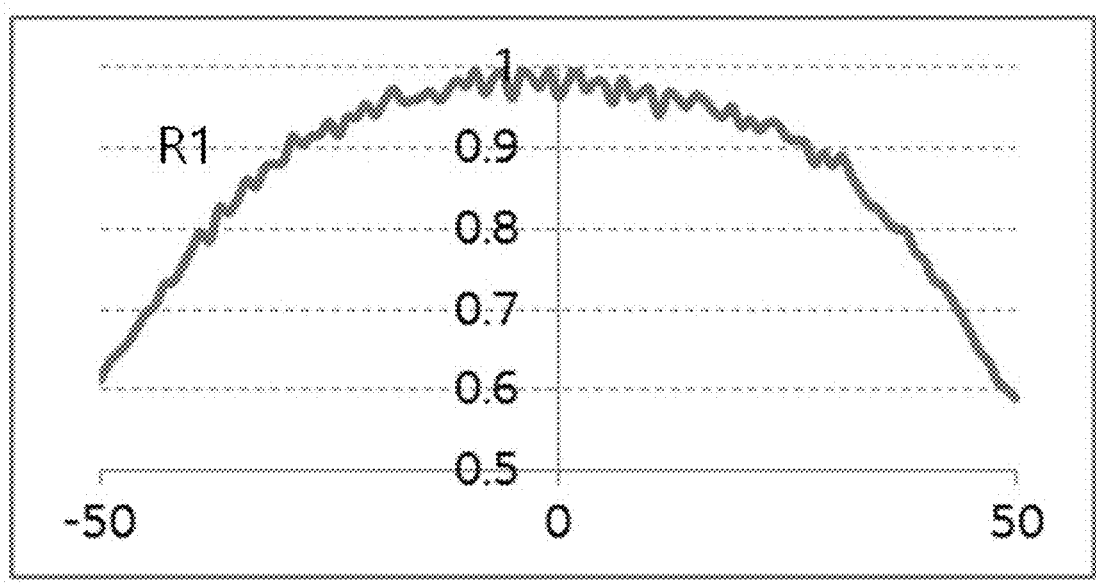
FIGS. 6A to 6C are graphs showing a light spectrum with respect to a viewing angle of red, green and blue colored lights, respectively, having passed through a first lens of an organic light emitting diode display device according to an embodiment of the present disclosure.
Figure 6B:
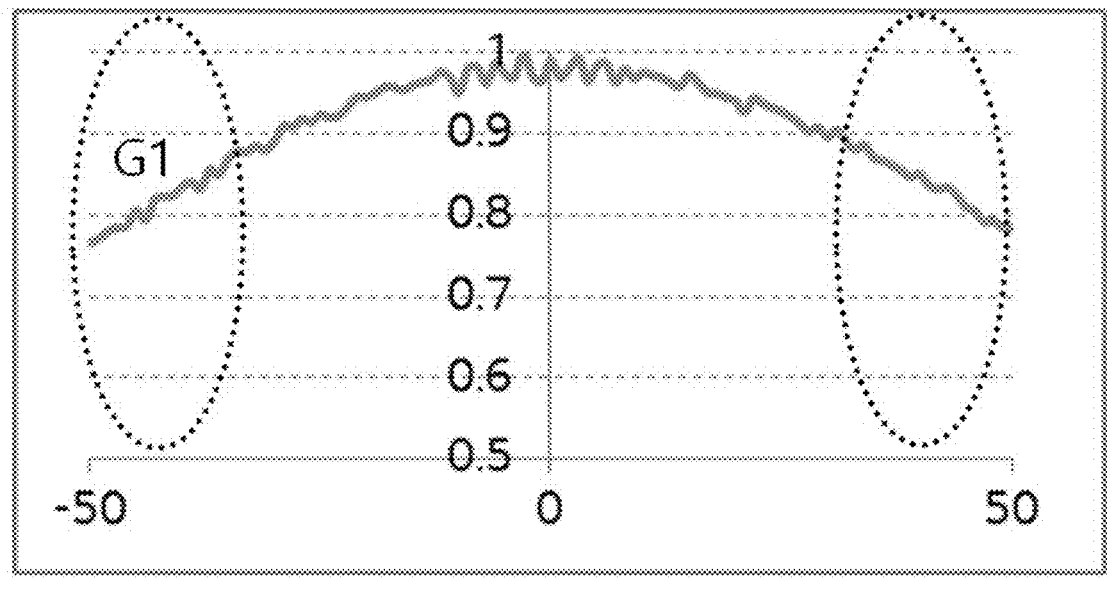
Figure 6C:
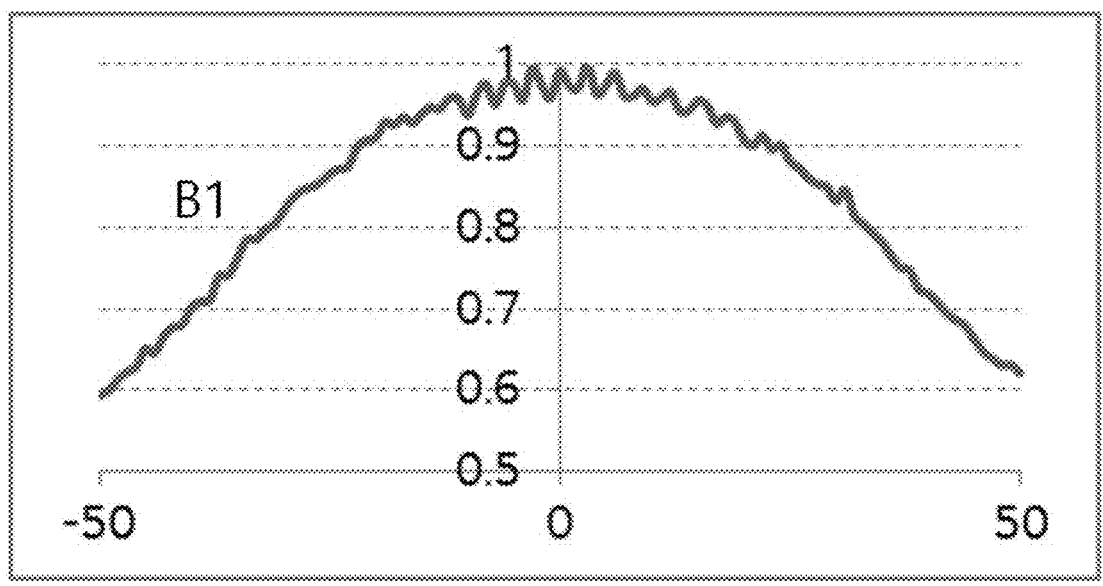
Figure 7A:
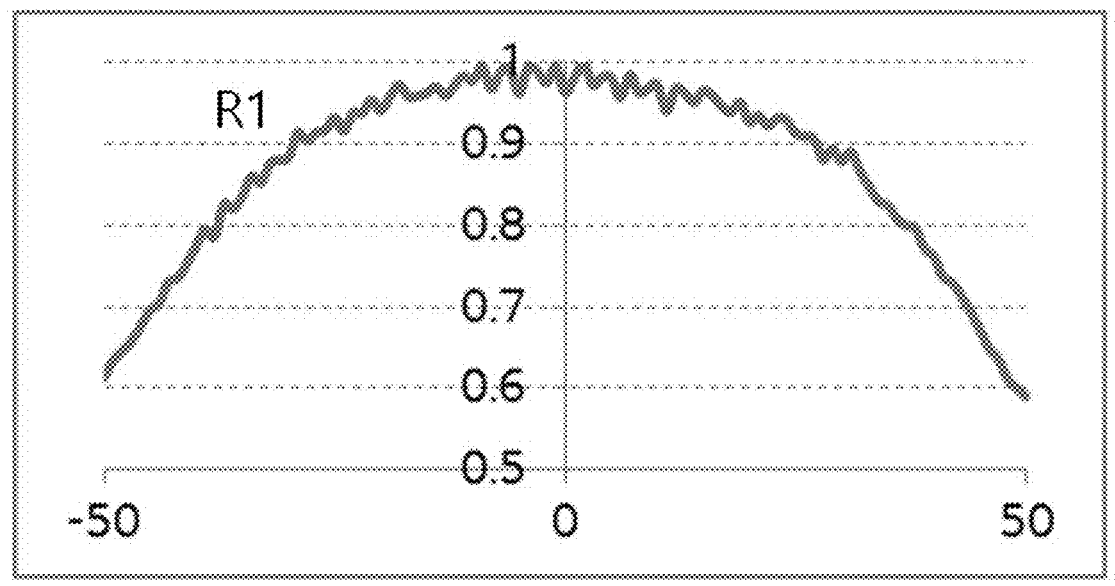
FIGS. 7A to 7C are graphs showing a light spectrum with respect to a viewing angle of red, green and blue colored lights, respectively, having passed through a second lens of an organic light emitting diode display device according to an embodiment of the present disclosure.
Figure 7B:
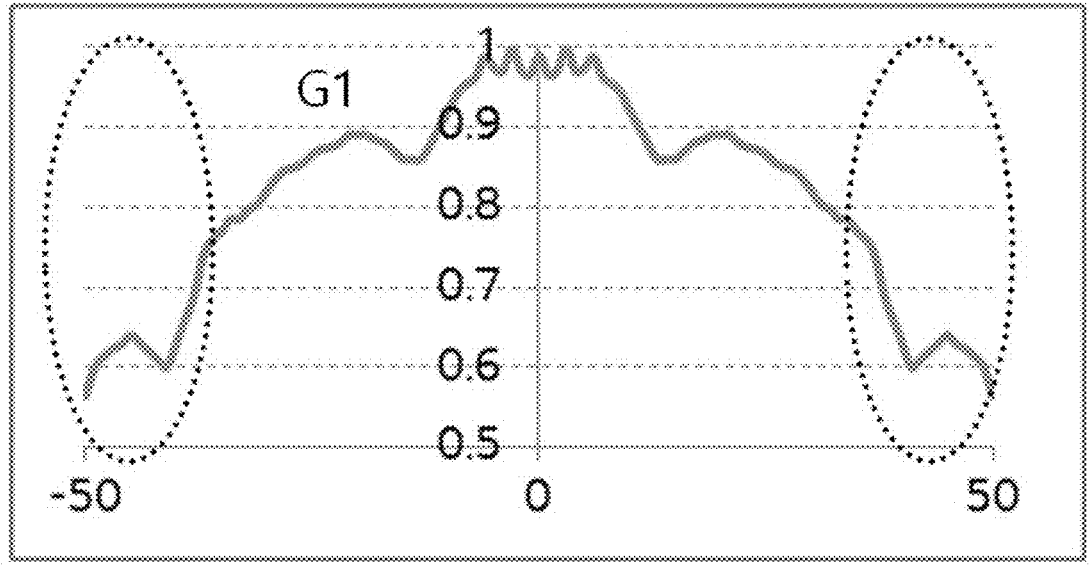
Figure 7C:
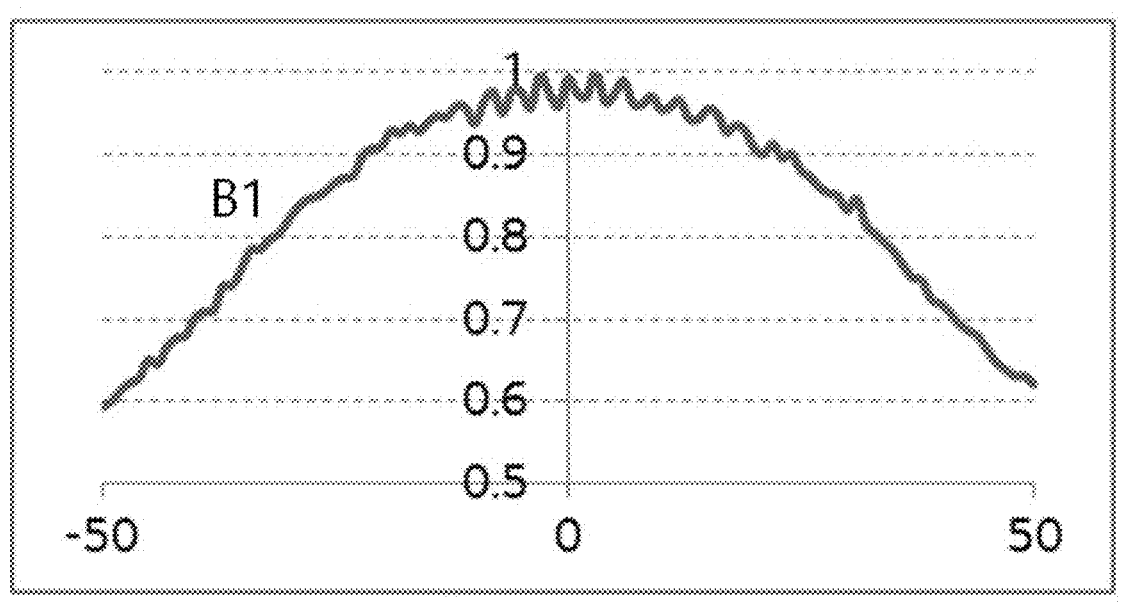

FIGS. 5A to 5C are graphs showing a light spectrum with respect to a viewing angle of red, green and blue colored lights, respectively, having passed through a substrate of an organic light emitting diode display device according to an embodiment of the present disclosure. FIGS. 6A to 6C are graphs showing a light spectrum with respect to a viewing angle of red, green and blue colored lights, respectively, having passed through a first lens of an organic light emitting diode display device according to an embodiment of the present disclosure. FIGS. 7A to 7C are graphs showing a light spectrum with respect to a viewing angle of red, green and blue colored lights, respectively, having passed through a second lens of an organic light emitting diode display device according to an embodiment of the present disclosure.

In FIGS. 5A to 5C, the emission intensity of the red and blue colored lights R1 and B1 having passed through the substrate 101 decreases from a front viewing angle to a side viewing angle, and the emission intensity of the green colored light G1 having passed through the substrate 101 is rarely changed according to the viewing angle.

In FIGS. 6A to 6C, after the green colored light G1 passes through the first lens 210, the emission intensity of the green colored light G1 at a front viewing angle is maintained and the emission intensity of the green colored light G1 at a side viewing angle decreases.

In FIGS. 7A to 7C, after the green colored light G1 passes through the second lens 220, the emission intensity of the green colored light G1 at a side viewing angle remarkably decreases.

As a result, since the green colored light G1 having passed through the first and second lenses 210 and 220 has the emission intensity similar to the red and blue colored lights R1 and B1 at the side viewing angle, the greenish phenomenon where a green color is viewed for a white color display is prevented.

In addition, a color sense difference of a white color display is minimized and an OLED display device where a recognition of a luminosity deterioration by a user is prevented.

In the OLED display device 100 according to an embodiment of the present disclosure, the transmittance controlling layer 200 is disposed on an outer surface of the substrate 101 where the light passes. The first lens 210 of the transmittance controlling layer 200 is disposed to correspond to the emission area EA of the green subpixel G-SP among the white, red, green and blue subpixels W-SP, R-SP, G-SP and B-SP, and the second lens 220 of the transmittance controlling layer 200 is disposed to correspond to cover the first lens 210, the green subpixel G-SP and the red and blue subpixels R-SP and B-SP adjacent to the green subpixel G-SP. As a result, a greenish phenomenon where a green color is viewed for a white color display is prevented.

In addition, a color sense difference of a white color display is minimized and an OLED display device where a recognition of a luminosity deterioration by a user is prevented.

Further, since the red and blue colored lights R1 and B1 of a high purity are emitted from the red and blue subpixels R-SP and B-SP, a color reproducibility is improved.

Although the light emitting diode E (of FIG. 2) includes two emitting layers 125a and 125b (of FIG. 2) in the OLED display device 100 according to an embodiment of the present disclosure, the light emitting diode may include three emitting layers in another embodiment.

When the light emitting diode includes three emitting layers, the three emitting layers may include a blue emitting layer, a red emitting layer and one of blue, deep blue and sky blue emitting layers.

The transmittance controlling layer 200 may be applied to the OLED display device 100 including the light emitting diode E (of FIG. 2) of two stack structure where a greenish phenomenon occurs.

Although the single second lens 220 covers the red, green and blue subpixels R-SP, G-SP and B-SP of the two adjacent unit pixels P in the OLED display device 100 according to an embodiment of the present disclosure, the second lens may cover the red, green and blue subpixels of each unit pixel in another embodiment.

Although the OLED display device 100 has a bottom emission type in an embodiment, the transmittance controlling layer may be disposed on an outer surface of a substrate or an encapsulation substrate corresponding to the emission direction regardless of the type in another embodiment.

When the OLED display device 100 has a top emission type, the transmittance controlling layer 200 may be disposed on an outer surface of the encapsulation substrate 104 and a refractive index of the first lens 210 of the transmittance controlling layer 200 is greater than a refractive index of the encapsulation substrate 104. Further, when the encapsulation substrate 104 is omitted and the passivation layer 102 is exposed, the transmittance controlling layer 200 is disposed on an outer surface of the passivation layer 102 and a refractive index of the first lens 210 of the transmittance controlling layer 200 is greater than a refractive index of the passivation layer 102.

Consequently, in the OLED display device 100 according to an embodiment of the present disclosure, a color sense difference is minimized and a recognition of a luminosity deterioration by a user is prevented.

It will be apparent to those skilled in the art that various modifications and variation can be made in the present disclosure without departing from the scope of the disclosure. Thus, it is intended that the present disclosure cover the modifications and variations of this disclosure provided they come within the scope of the appended claims.

What is claimed is:

1. An organic light emitting diode display device comprising:

a substrate including first, second, and third subpixels;

first, second, and third light emitting diodes in the first, second, and third subpixels, respectively, on a first surface of the substrate; and a transmittance controlling layer on a second surface of the substrate corresponding to an emission direction of light emitted from the first, second, and third light emitting diodes, the transmittance controlling layer including a first lens and a second lens covering the first lens, the second surface of the substrate being opposite to the first surface of the substrate, wherein the second subpixel includes a green subpixel, wherein the first lens is disposed to correspond to an emission area of the green subpixel, wherein the second lens is disposed to correspond to the first, second, and third subpixels, wherein the second surface of the substrate has first and second areas overlapping the first and third subpixels, respectively, and wherein the second lens contacts the first and second areas of the second surface of the substrate.

2. The device of claim 1, wherein the second lens has an absorption wavelength peak of 530 nm to 540 nm.

3. The device of claim 1, wherein the second lens has a first thickness corresponding to the green subpixel and a second thickness corresponding to an outer periphery of the first lens, and wherein the second thickness is greater than the first thickness.

4. The device of claim 3, wherein the first thickness is a local minimum thickness of the second lens in the green subpixel.

5. The device of claim 1, wherein a refractive index of the first lens is greater than refractive indexes of the substrate and the second lens by 0.1 or more.

6. The device of claim 5, wherein the first lens has a refractive index of 1.6 to 1.8.

7. The device of claim 6, wherein the second lens has a refractive index of 1.4 to 1.5.

8. The device of claim 7, wherein the transmittance controlling layer further includes a planarizing layer covering the second lens, and wherein the planarizing layer has a refractive index of 1.4 to 1.5.

9. The device of claim 1, wherein the first, second, and third subpixels include one of red and blue subpixels.

10. The device of claim 1, wherein the first, second, and third light emitting diodes emit a white colored light, and wherein red, green and blue color filter patterns-are disposed between the transmittance controlling layer and the first, second, and third light emitting diodes to correspond to emission areas of the first to third subpixels.

11. The device of claim 1, wherein the substrate further includes a white subpixel, and wherein a fourth light emitting diode is disposed in the white subpixel on the substrate.

12. The device of claim 11, wherein a white color filter pattern is disposed between the transmittance controlling layer and the fourth light emitting diode to correspond to an emission area of the white subpixel.

13. The device of claim 11, wherein the white subpixel is exposed outside the second lens.

14. The device of claim 1, wherein the second lens directly contacts the first lens.

15. The device of claim 1, wherein the second surface of the substrate further has a third area overlapping the second subpixel, and the first lens contact the third area of the second surface of the substrate.

16. The device of claim 1, wherein a width of the second lens corresponds to a sum of a width of the first subpixel, a width of the second subpixel and a width of the third subpixel.

* * * * *